(12) United States Patent
Yang et al.

(10) Patent No.: US 8,587,128 B2
(45) Date of Patent: Nov. 19, 2013

(54) DAMASCENE STRUCTURE

(75) Inventors: Yu-Ru Yang, I-Lan (TW);
Chien-Chung Huang, Taichung (TW)

(73) Assignee: United Microelectronics Corporation, Hsin-Chu (TW)

( * ) Notice: Subject to any disclaimer, the term of this patent is extended or adjusted under 35 U.S.C. 154(b) by 0 days.

(21) Appl. No.: 13/397,833

(22) Filed: Feb. 16, 2012

(65) Prior Publication Data
US 2012/0146225 A1 Jun. 14, 2012

Related U.S. Application Data

(60) Division of application No. 12/626,925, filed on Nov. 29, 2009, which is a continuation-in-part of application No. 11/646,387, filed on Dec. 28, 2006, now Pat. No. 7,645,698, which is a continuation of application No. 10/841,562, filed on May 10, 2004, now Pat. No. 7,199,040, which is a division of application No. 10/461,346, filed on Jun. 16, 2003, now abandoned.

(51) Int. Cl.
*H01L 23/48* (2006.01)

(52) U.S. Cl.
USPC .............................. 257/774; 257/637; 257/758

(58) Field of Classification Search
USPC .......................................... 257/637, 758, 774
See application file for complete search history.

(56) References Cited

U.S. PATENT DOCUMENTS

| | | | |
|---|---|---|---|
| 5,534,463 A | 7/1996 | Lee et al. | |
| 5,930,669 A | 7/1999 | Uzoh | |
| 6,016,012 A | 1/2000 | Chatila et al. | |
| 6,261,963 B1 | 7/2001 | Zhao et al. | |
| 6,342,448 B1 | 1/2002 | Lin et al. | |
| 6,383,920 B1 | 5/2002 | Wang et al. | |
| 6,472,757 B2 | 10/2002 | Marathe et al. | |
| 6,972,254 B1 | 12/2005 | Lopatin et al. | |
| 2002/0090811 A1 | 7/2002 | Kim et al. | |

*Primary Examiner* — Ori Nadav
(74) *Attorney, Agent, or Firm* — WPAT, PC; Justin King

(57) ABSTRACT

A damascene structure includes a conductive layer, a first dielectric layer, a first barrier metal layer, a barrier layer, and a second barrier metal layer sequentially formed on the conductive layer. The first dielectric layer having a via therein. The barrier layer is comprised of a material different with that of the first barrier metal layer. A bottom of the barrier layer disposed on the via bottom is not punched through. The accomplished barrier layers will have lower resistivity on the via bottom in the first dielectric layer and they are capable of preventing copper atoms from diffusing into the dielectric layer.

11 Claims, 14 Drawing Sheets

DAMASCENE STRUCTURE

CROSS-REFERENCE TO RELATED APPLICATIONS

This application is a divisional of U.S. patent application Ser. No. 12/626,925 filed on Nov. 29, 2009, which is a continuation-in-part of U.S. patent application Ser. No. 11/646,387 filed on Dec. 28, 2006 now U.S. Pat. No. 7,645,698, which is a continuation of U.S. patent application Ser. No. 10/841,562, filed on May 10, 2004 now U.S. Pat. No. 7,199,040, which is a divisional of U.S. patent application Ser. No. 10/461,346, filed Jun. 16, 2003 now abandoned, all of which are commonly assigned.

BACKGROUND

1. Field of the Invention

The present invention relates to a method for the manufacture of semiconductor devices and more particularly to the method for forming a barrier layer in a damascene structure.

2. Description of the Prior Art

In the processes for the manufacture of semiconductor devices, when the active elements of these semiconductor devices are constructed, the following work will be the manufacture of the metal conductive layers above these active elements to complete the electrical interconnection inside the semiconductor devices. The processes for the manufacture of the metal conductive layers are usually as follows: first, forming a metal layer above the active regions of the semiconductor devices, second, proceeding with photoresist coating, developing, and etching to complete the manufacture of a first metal layer, third, depositing a dielectric layer on the first metal layer, and finally proceeding with the manufacture of multiple metal layers dependent on the needs of the different semiconductor devices.

For many years, materials of metal conductive layers of semiconductors are mainly aluminum and aluminum alloys. However, as sizes of semiconductor devices get more and more smaller, operating speeds of semiconductor devices get more and more faster, and power consumptions of semiconductor devices get more and more lower, it is necessary to use metal materials of lower resistivity and dielectric materials of low dielectric constant to complete the electrical interconnection inside semiconductor devices. U.S. Pat. No. 6,489,240 B1 cites using copper and dielectric materials of dielectric constant lower than 4 to complete the electrical interconnection inside semiconductor devices. When copper is used as the material of metal conductors of semiconductors, as shown in FIG. 1A, considering that copper is difficult to be vaporized after etching processes, a dual damascene structure 10 is often used to proceed with copper forming processes inside the dual damascene structure 10. U.S. Pat. No. 6,492,270 B1 mentions the details of forming copper dual damascene. A dual damascene structure 10 comprises a first etch-stop layer 120, a first dielectric layer 160, a second etch-stop layer 140, and a second dielectric layer 180. Before copper processes inside the dual damascene structure 10 above the copper metal layer 100 are performed, as shown in FIG. 1B, a barrier layer 190 has to be formed to prevent copper atoms from diffusing into surrounding dielectric layers.

In order to prevent copper atoms from diffusing into dielectric layers in the prior art, titanium nitride (TiN) or tantalum nitride (TaN) is usually used to form a barrier layer. U.S. Pat. No. 6,541,374 B1 mentions details of forming a barrier layer with TiN. Practically, when the barrier layer 190 is deposited, as a result of the direction of depositing is about perpendicular to the wafer surface, the thickness of the sidewall of the dual damascene structure 10 will be about one-fifth to a half of the thickness above the via bottom in the first dielectric layer 160 and above the trench bottom in the second dielectric layer 180, easily causing that the deposition of the sidewall of the dual damascene structure 10 is incomplete and copper atoms formed later in the dual damascene structure 10 diffuse into surrounding dielectric layers. Consequently the electric property of the surrounding dielectric layers will be affected and then the semiconductor devices will be damaged. Accordingly there is a need for completely depositing a barrier layer of the sidewall of a dual damascene structure 10 to prevent copper atoms from diffusing into surrounding dielectric layers.

In the other hand, the resistivity of nitrided metal materials in the prior art is far more higher than the resistivity of metal materials. Hence if TiN or TaN is used as the material of the barrier layer 190 in the dual damascene structure 10, the resistivity between metals in the dual damascene structure 10 will be so high that the operating speed and the power consumption of the semiconductor devices will be influenced. Therefore there is a need for reducing the resistivity of the barrier layer 190 above the via bottom in the first dielectric layer 160.

BRIEF SUMMARY

One main purpose of the present invention is to use the barrier layer formed by at least two metal layers and a barrier layer of metallized materials to fully prevent copper atoms from diffusing into surrounding dielectric layers.

The other main purpose of the present invention is to reduce the resistivity of the barrier layer above the via bottom in the dielectric layer of a dual damascene structure and to make a good ohmic contact between the barrier layer and the copper layer below the barrier layer and the copper layer later formed above the barrier layer.

In one embodiment, a damascene structure is disclosed. The damascene structure includes a conductive layer, a first dielectric layer, a first barrier metal layer, a barrier layer, a second barrier metal layer and a third barrier metal layer. The first dielectric layer is disposed on the conductive layer, and has a via therein. The first barrier metal layer is disposed on the via bottom and the via sidewall in the first dielectric layer. The first barrier metal layer covers the conductive layer on the via bottom. The barrier layer is comprised of a material different with that of the first barrier metal layer. The second barrier metal layer covers the barrier layer on the via sidewall, and exposes the barrier layer on the via bottom. The third barrier metal layer covers the second barrier metal layer on the via sidewall, and covers the first barrier metal layer on the via bottom. A bottom of the barrier layer disposed on the via bottom is not punched through.

The present invention uses chemical vapor deposition processes or physical vapor deposition processes to form a barrier layer on a conductive layer of a semiconductor device and then uses ion-bombardment to remove metallized materials of higher resistivity to reduce the resistivity of the barrier layer neighboring to the conductive layer.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
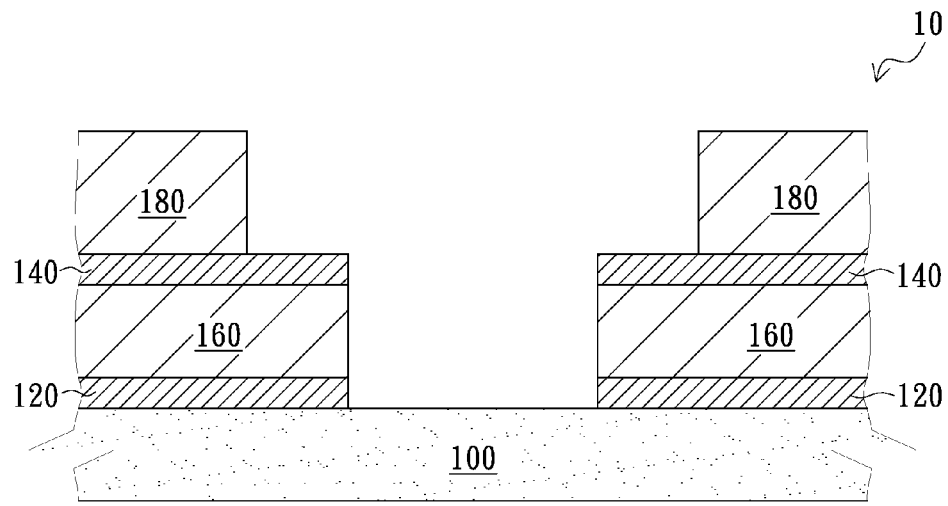
FIG. 1A shows an illustrative chart of a dual damascene structure of the prior art.
Figure 1B:
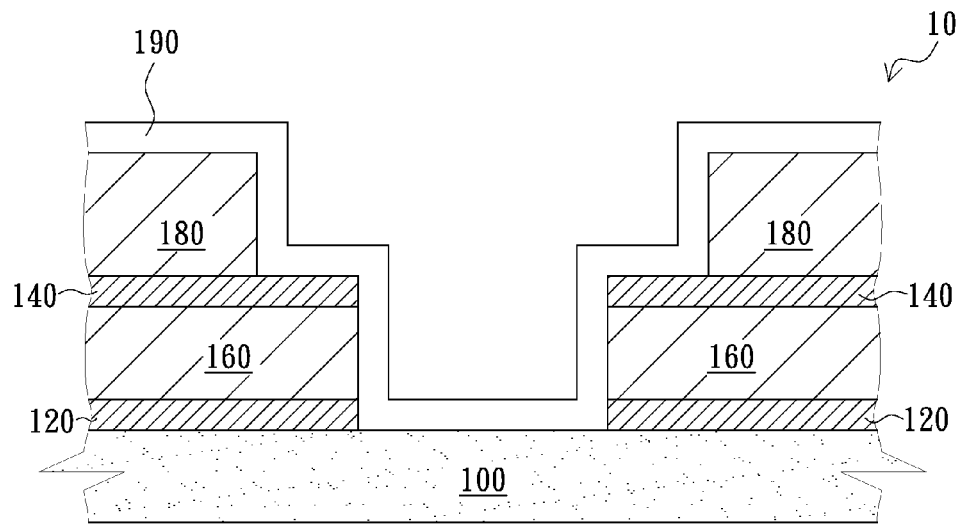
FIG. 1B shows an illustrative chart of forming a barrier layer on a dual damascene structure of the prior art.

Some embodiments of the invention will be described exquisitely as below. Besides, the invention can also be practiced extensively in other embodiments. That is to say, the scope of the invention should not be restricted by the proposed embodiments. The scope of the invention should be based on the claims proposed later.

In a first embodiment of the present invention, as shown in FIGS. 2A-2E, a dual damascene structure 20 has been already formed on a metal layer 200 of a wafer. The dual damascene structure 20 comprises a first etch-stop layer 220, a first dielectric layer 260 on the first etch-stop layer 220, a second etch-stop layer 240 on the first dielectric layer 260, and a second dielectric layer 280 on the second etch-stop layer 240, wherein the metal layer 200 is a copper layer. A material of the first etch-stop layer 220 and the second etch-stop layer 240 is the one which can prevent copper atoms from diffusing into surrounding dielectric layers, such as silicon nitride (Si.sub.3N.sub.4). The material of the first dielectric layer 260 and the second dielectric layer 280 can be silicon dioxide or any other material whose dielectric constant is lower than 4, such as fluorinated silicate glass (FSG), organo silicate glass, fluorinated amorphous carbon, hydrogenated amorphous carbon, and tetrafluoropoly-p-xylylene. The first dielectric layer 260 and the second dielectric layer 280 of these materials can be formed by chemical vapor deposition processes. The material of the first dielectric layer 260 and the second dielectric layer 280 can also be hydrogenated silsesquioxane (HSQ), poly arylene ethers (PAE), co-polymer of divinylsiloxane and bis-Benzocyclobutene, aerogel, and xerogel. The first dielectric layer 260 and the second dielectric layer 280 can be formed by spin coating.

Figure 2A:
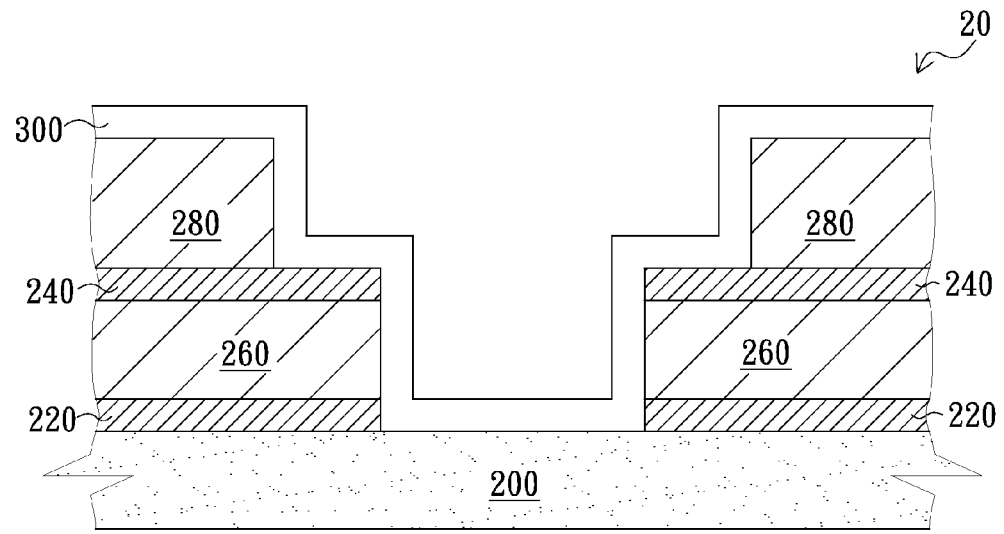
FIGS. 2A-2E shows an illustrative chart of the steps for forming multi-barrier layers on a dual damascene structure of a first embodiment in the present invention.
Figure 4:
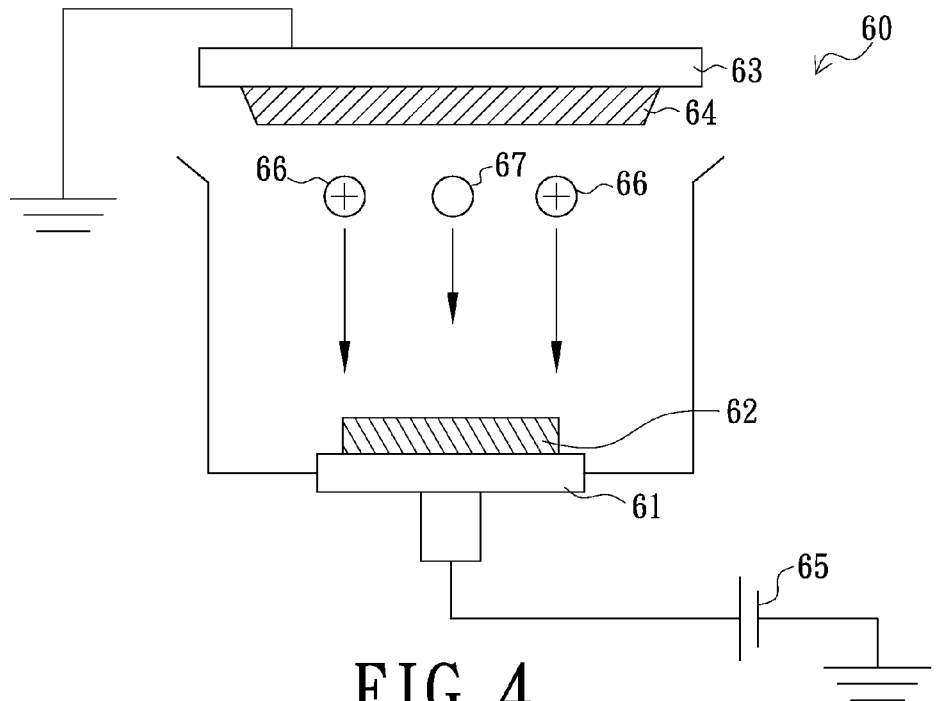
FIG. 4 shows an illustrative chart of proceeding with physical vapor deposition processes in a plasma reactor in the present invention.

As shown in FIG. 2A, a first tantalum layer 300 is formed on the dual damascene structure 20 and the first tantalum layer 300 can be formed by chemical vapor deposition (CVD) processes or physical vapor deposition (PVD) processes. The first tantalum layer 300 is formed by PVD processes in the present embodiment. A plasma reactor 60 is shown in FIG. 4, a wafer 62 is secured to a wafer supporter 61 and the wafer supporter 61 is connected to a direct current (DC) bias 65. A tantalum target 64 is secured to a metal target base 63 and the metal target base 63 is grounded. In the PVD processes, argon ions will bombard the tantalum target 64 and the tantalum atoms or ions bombarded out by argon ions will be attracted by the DC bias 65 and deposited on the wafer 62 thereby forming the first tantalum layer 300. In the PVD processes, the process pressure in the plasma reactor 60 is about from 0 torrs to 50 millitorrs and the process temperature in the plasma reactor 60 is about from 0 degrees centigrade to 400 degrees centigrade.

Figure 2B:
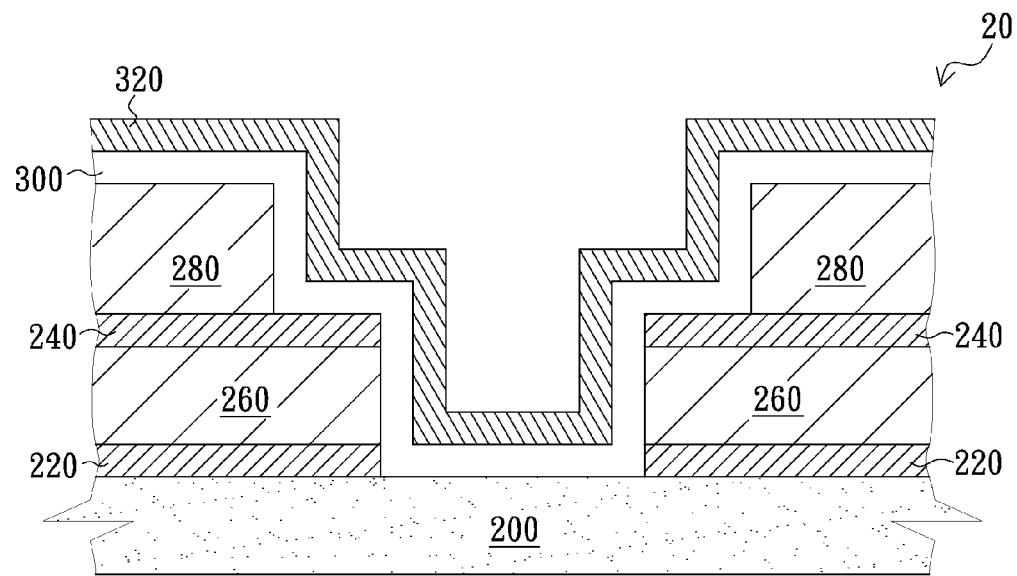

As shown in FIG. 2B, a tantalum nitride layer 320 is formed on the first tantalum layer 300 and the tantalum nitride layer 320 can be formed by CVD processes or PVD processes. The tantalum nitride layer 320 is formed by PVD processes in the present embodiment. Similar to the way of forming the first tantalum layer 300, nitrogen gas is introduced into the plasma reactor 60 and the nitrogen molecules will react with the tantalum atoms 67 or tantalum ions 66 from the tantalum target 64, which is bombarded by argon ions to form the tantalum nitride layer 320 on the wafer 62. In the PVD processes, the process pressure in the plasma reactor 60 is about from 0 torrs to 50 millitorrs and the process temperature in the plasma reactor 60 is about from 0 degrees centigrade to 400 degrees centigrade.

The resistivity of the tantalum nitride layer 320 varies with the proportion of the nitrogen atoms. Generally, the resistivity of the tantalum nitride layer 320 is about between 95 micro-ohms centimeter and 14800 micro-ohms centimeter. The resistivity of the tantalum nitride layer 320 is far more than the resistivity of a tantalum layer. The resistivity of an α-phase tantalum layer is about between 15 micro-ohms centimeter and 30 micro-ohms centimeter and the resistivity of a β-phase tantalum layer is about between 150 micro-ohms centimeter and 220 micro-ohms centimeter. However, the resistivity of a copper layer is about 1.7 micro-ohms centimeter. Accordingly, in order to reduce the resistivity above the via bottom in the first dielectric layer 260, the tantalum nitride layer 320 above the via bottom in the first dielectric layer 260 has to be removed.

Figure 2C:
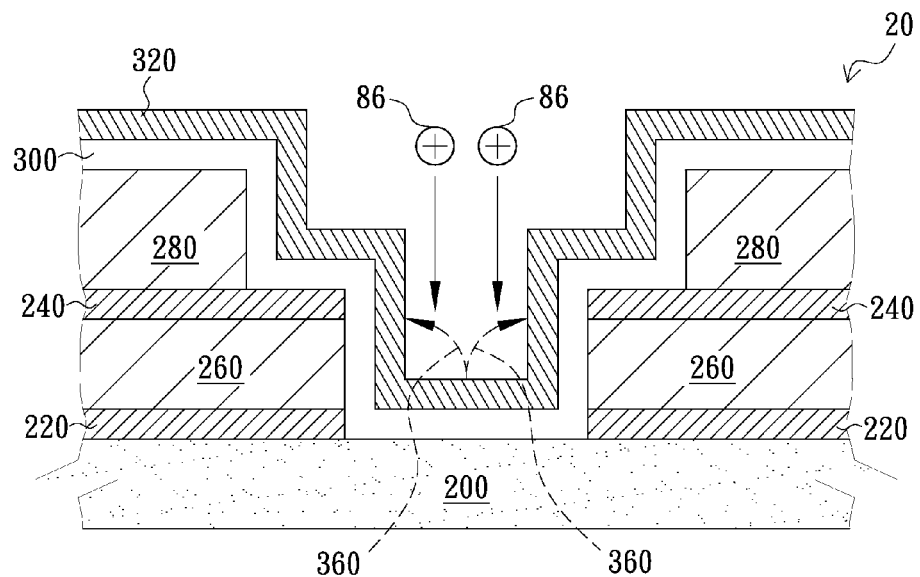
Figure 5:
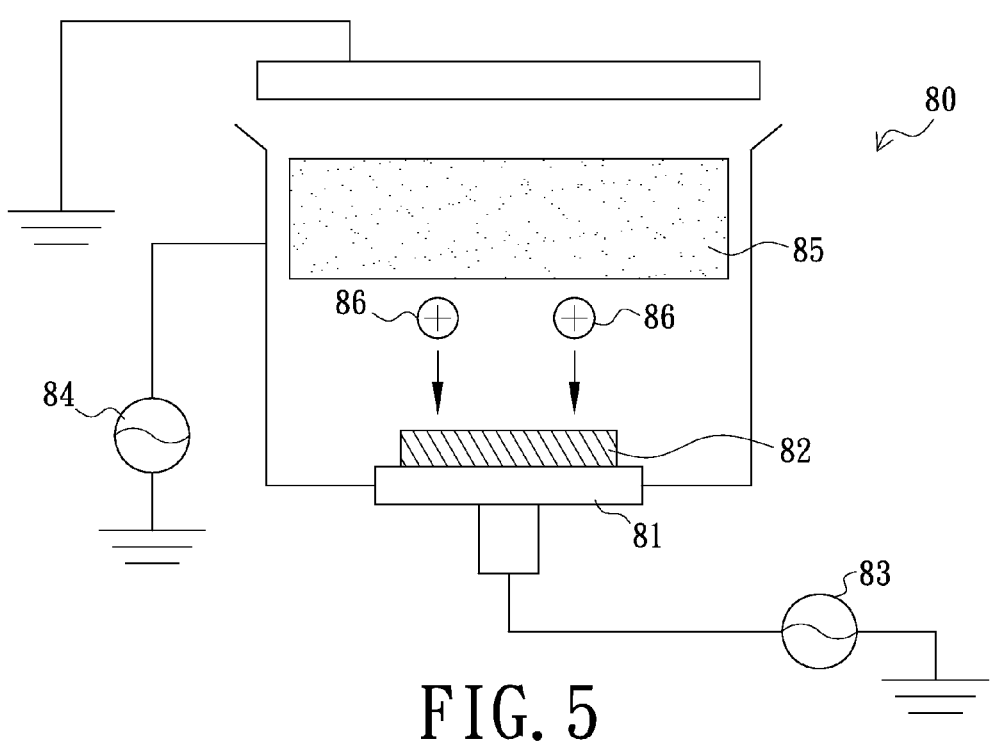
FIG. 5 shows an illustrative chart of proceeding with ion-bombardment processes in a plasma reactor in the present invention.

As shown in FIG. 2C, in order to remove the tantalum nitride layer 320 above the via bottom in the first dielectric layer 260, a method of ion-bombardment is taken. As shown in FIG. 5, a plasma reactor 80 is connected with a plasma generating power 84 and an alternating current bias power 83. A wafer 82 is secured to a wafer supporter 81 in the plasma reactor 80. When an ion-bombardment process is proceeded with, a self-direct current bias produced by the alternating current bias power 83 attracts argon ions 86 in the plasma 85 to bombard the wafer 82. Then the tantalum atoms 360, which escape from the tantalum nitride layer 320 above the via bottom in the first dielectric layer 260, will be deposited on the via sidewall in the first dielectric layer 260. The tantalum nitride layer 320 above the via bottom in the first dielectric layer 260 is removed. Because a moving direction of the argon atoms 86 is perpendicular to a surface of the wafer 82, the tantalum nitride layer 320 deposited on the via sidewall in the first dielectric layer 260 sustains less ion-bombardment than the tantalum nitride layer 320 deposited above the via bottom in the first dielectric layer 260. In the present embodiment, the self-direct current bias produced on the wafer supporter 81 is higher than the direct current bias in the PVD processes for deposition of the tantalum layer or the tantalum nitride layer.

Figure 2D:
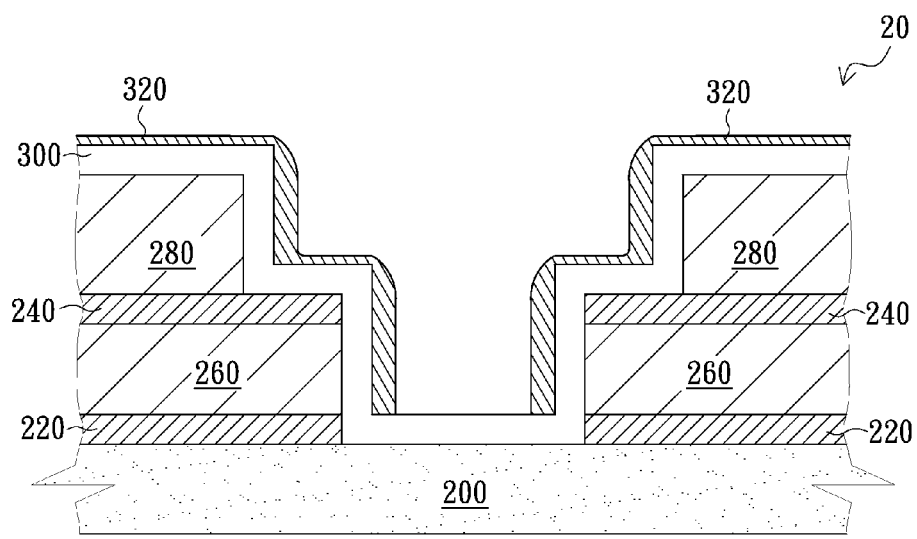
Figure 2E:
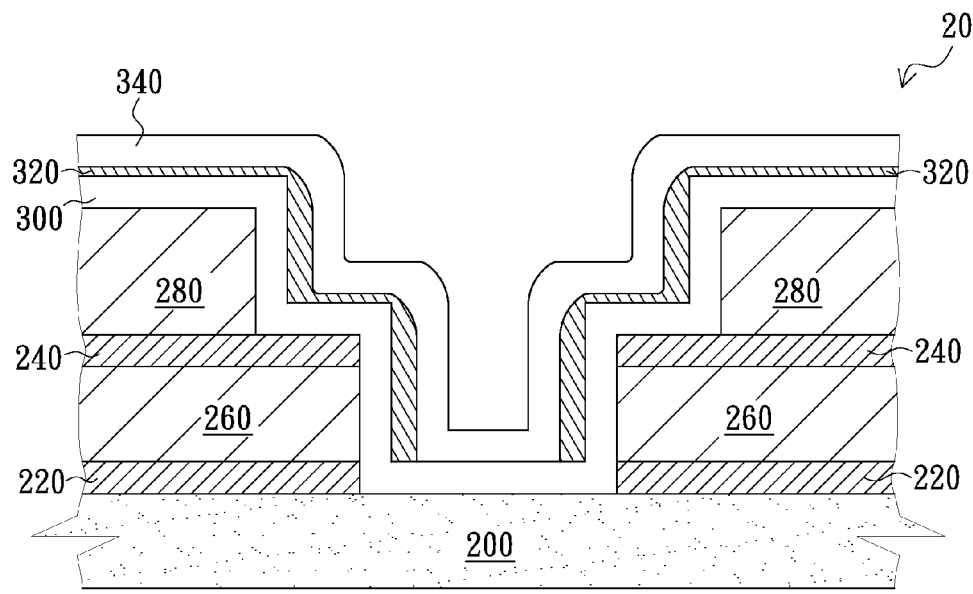

After the tantalum nitride layer 320 above the via bottom in the first dielectric layer 260 is removed by the method of ion-bombardment, the structure above the metal layer 200 is shown in FIG. 2D. Only the first tantalum layer 300 exists above the via bottom in the first dielectric layer 260. The tantalum atoms 360 sputtered from the via bottom in the first dielectric layer 260 and from the trench bottom in the second dielectric layer 280 will then separately be deposited on the sidewall of the downside of the via in the first dielectric layer 260 and on the sidewall of the downside of the trench in the second dielectric layer 280. The figure of the structure is shown in FIG. 2D. Further, as shown in FIG. 2E, a second tantalum layer 340 is formed on the tantalum nitride layer 320 by the method such as the aforementioned method used for forming the first tantalum layer 300. The second tantalum layer 340 can be formed by PVD processes or CVD processes. The second tantalum layer 340 is formed by PVD processes in the embodiment. A plasma reactor 60 is shown in FIG. 4, a wafer 62 is secured to a wafer supporter 61 and the wafer supporter 61 is connected to a direct current (DC) bias 65. A tantalum target 64 is secured to a metal target base 63 and the metal target base 63 is grounded. In the PVD processes, argon ions will bombard the tantalum target 64 and the tantalum atoms or ions bombarded out by argon ions will be attracted by the DC bias 65 to be deposited on the wafer 62 thereby forming the second tantalum layer 340. In the PVD processes, the process pressure in the plasma reactor 60 is about from 0 torr to 50 millitorrs and the process temperature in the plasma reactor 60 is about from 0 degrees centigrade to 400 degrees centigrade.

After completing the aforementioned steps, the barrier layers of the dual damascene structure 20 are shown in FIG. 2E. Only the tantalum layer, which consists of the first tantalum layer 300 and the second tantalum layer 340, exists above the via bottom in the first dielectric layer 260 of the dual damascene structure 20, however, all the three barrier layers exist on all the other portions of the dual damascene structure 20 except the via bottom. The three barrier layers are the first tantalum layer 300, the tantalum nitride layer 320, and the second tantalum layer 340 respectively. The tantalum is used because it has good adhesion to copper. The tantalum nitride is capable of preventing copper atoms from diffusing into surrounding dielectric layers. The barrier structure of the three barrier layers is thicker than the barrier layer at the side wall portion of a dual damascene structure in the prior art and thus the three barrier layers prevent copper atoms from diffusing into surrounding dielectric layers more efficiently. Besides, a portion of the barrier layer structure above the via bottom has a 30% lower resistance than of the prior art. Therefore, the tantalum layer has better ohmic contact with the copper layer below and the copper layer formed inside the dual damascene structure later.

In another embodiment of the present disclosure, as shown in FIGS. 3A-3E, a damascene structure 40 has been already formed on a metal layer 400 of a wafer. The damascene structure 40 comprises an etch-stop layer 420 and a dielectric layer 440 on the etch-stop layer 420. The metal layer 400 is a copper layer. The etch-stop layer 420 consists of a material which can prevent copper atoms from diffusing into surrounding dielectric layers such as silicon nitride ($Si_3N_4$). The material of the dielectric layer 440 can be silicon dioxide or any other material whose dielectric constant is lower than 4, such as fluorinated silicate glass (FSG), organo silicate glass, fluorinated amorphous carbon, hydrogenated amorphous carbon, and tetrafluoropoly-p-xylylene. The dielectric layer 440 of these materials can be formed by chemical vapor deposition processes. The material of the dielectric layer 440 can also be hydrogenated silsesquioxane (HSQ), poly arylene ethers (PAE), co-polymar of divinylsiloxane and bis-Benzocyclobutene, aerogel, and xerogel, and dielectric layer 440 of these materials can be formed by spin coating.

Figure 3A:
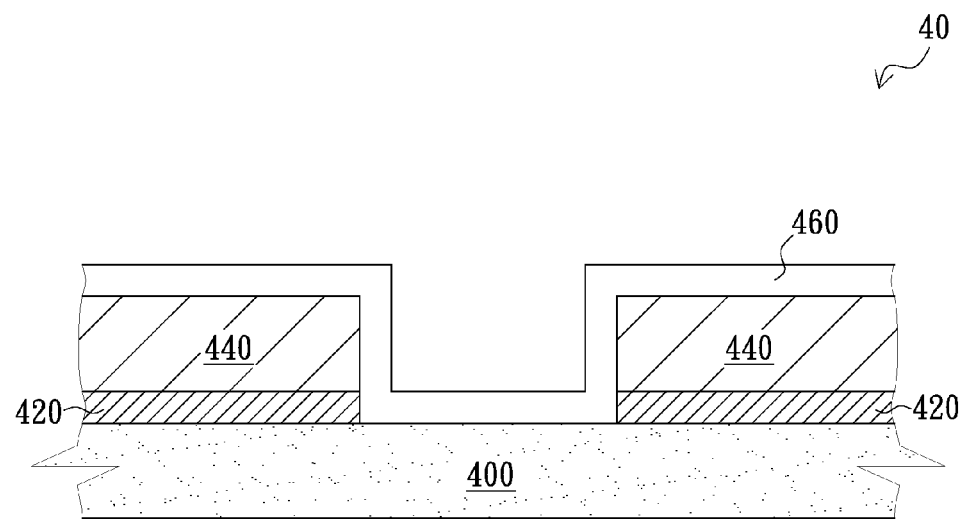
FIGS. 3A-3E shows an illustrative chart of the steps for forming multi-barrier layers on a damascene structure of a second embodiment in the present invention.

As shown in FIG. 3A, a first tantalum layer 460 is formed on the damascene structure 40 and the first tantalum layer 460 can be formed by chemical vapor deposition (CVD) processes or physical vapor deposition (PVD) processes. The first tantalum layer 460 is formed by PVD processes in the present embodiment. A plasma reactor 60 is shown in FIG. 4, a wafer 62 is secured to a wafer supporter 61 and the wafer supporter 61 is connected to a direct current (DC) bias 65. A tantalum target 64 is secured to a metal target base 63 and the metal target base 63 is grounded. In the PVD processes, argon ions will bombard the tantalum target 64 and the tantalum atoms or ions bombarded out by the argon ions will be attracted by the DC bias 65 to be deposited on the wafer 62 thereby forming the first tantalum layer 460. In the PVD processes, the process pressure in the plasma reactor 60 is about from 0 torr tos 50 millitorrs and the process temperature in the plasma reactor 60 is about from 0 degrees centigrade to 400 degrees centigrade.

Figure 3B:
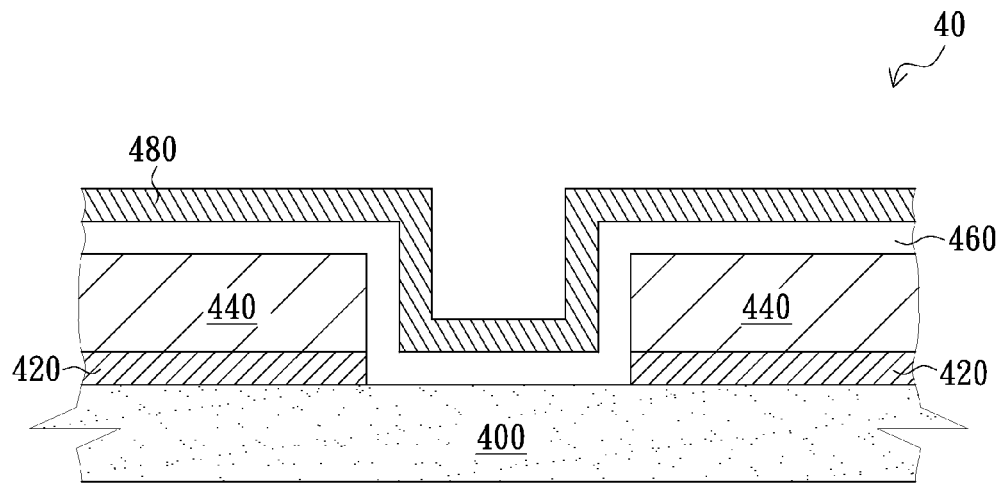

As shown in FIG. 3B, a tantalum nitride layer 480 is formed on the first tantalum layer 460 and the tantalum nitride layer 480 can be formed by CVD processes or PVD processes. The tantalum nitride layer 480 is formed by PVD processes in the present embodiment. Similar to the way of forming the first tantalum layer 460, nitrogen gas is introduced into the plasma reactor 60 and the nitrogen molecules will react with the tantalum atoms 67 or tantalum ions 66 from the tantalum target 64 to form the tantalum nitride layer 480. In the PVD processes, the process pressure in the plasma reactor 60 is about from 0 torrs to 50 millitorrs and the process temperature in the plasma reactor 60 is about from 0 degrees centigrade to 400 degrees centigrade.

The resistivity of the tantalum nitride layer 480 varies with the proportion of the nitrogen atoms. Generally, the resistivity is about between 95 micro-ohms centimeter and 14800 micro-ohms centimeter. The resistivity of the tantalum nitride layer 480 is far more than the resistivity of a tantalum layer. The resistivity of the α-phase tantalum layer is about between 15 micro-ohms centimeter and 30 micro-ohms centimeter and the resistivity of the β-phase tantalum layer is about between 150 micro-ohms centimeter and 220 micro-ohms centimeter. However, the resistivity of a copper layer is about 1.7 micro-ohms centimeter. Accordingly, to reduce the resistivity above the via bottom in the dielectric layer 440, the tantalum nitride layer 480 above the via bottom in the dielectric layer 440 has to be removed.

Figure 3C:
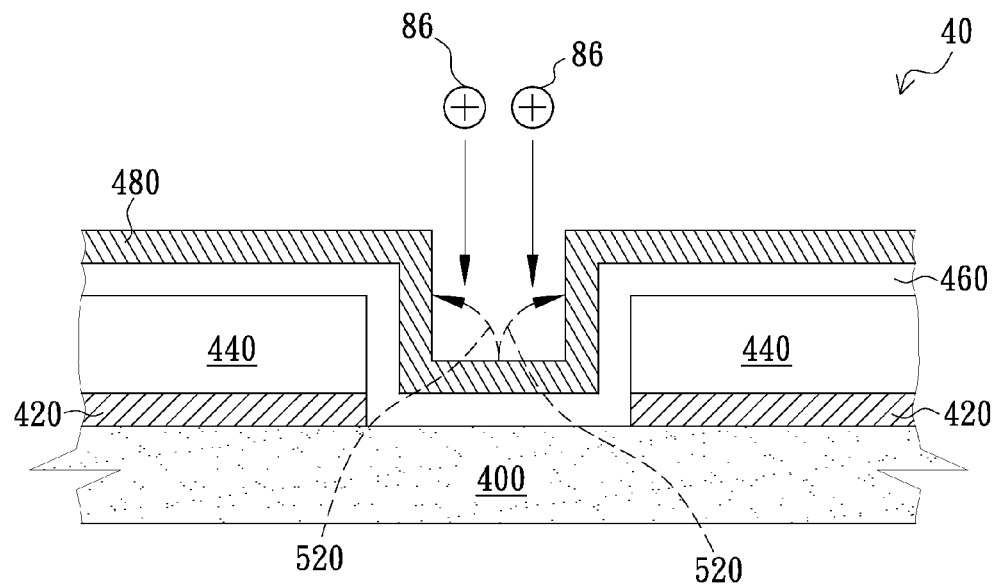

As shown in FIG. 3C, in order to remove the tantalum nitride layer 480 above the via bottom in the dielectric layer 440, a method of ion-bombardment is taken. As shown in FIG. 5, a plasma reactor 80 is connected with a plasma generating power 84 and an alternating current bias power 83. A wafer 82 is secured to a wafer supporter 81 in the plasma reactor 80. When an ion-bombardment process is proceeded with, a self-direct current bias produced by the alternating current bias power 83 attracts argon ions 86 in the plasma 85 to bombard the wafer 82, and then tantalum atoms 520, which escape from the tantalum nitride layer 480 above the via bottom in the dielectric layer 440, will be deposited on the via sidewall in the dielectric layer 440. The tantalum nitride layer 480 above the via bottom in the dielectric layer 440 is removed. Because a moving direction of the argon atoms 86 is perpendicular to a surface of the wafer 82, the tantalum nitride layer 480 deposited on the via sidewall in the dielectric layer 440 sustains less ion-bombardment than the tantalum nitride layer 480 deposited above the via bottom in the dielectric layer 440. In the present embodiment, the self-direct current bias produced on the wafer supporter 81 is higher than the direct current bias in the PVD processes for deposition of the tantalum layer or the tantalum nitride layer.

Figure 3D:
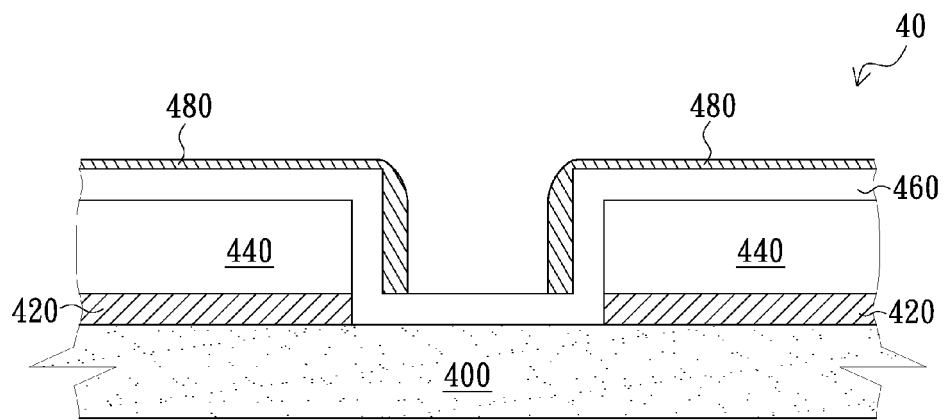
Figure 3E:
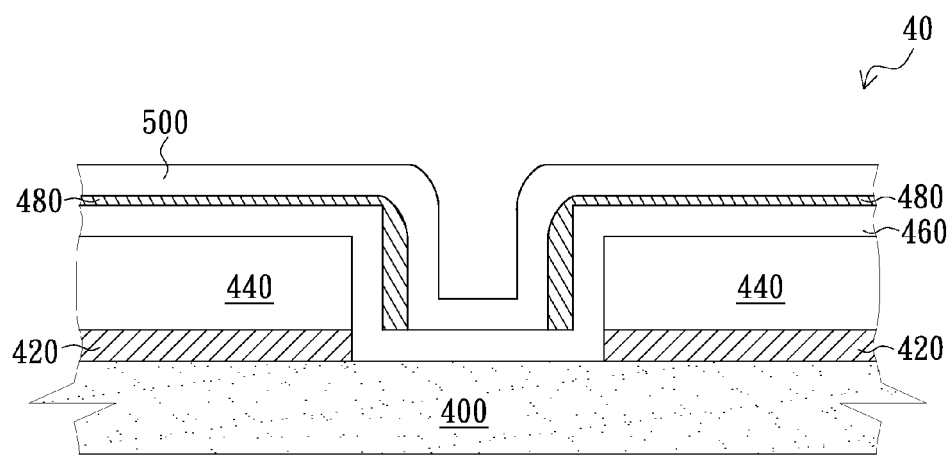

After the tantalum nitride layer 480 above the via bottom in the dielectric layer 440 is removed by the method of ion-bombardment, the structure above the metal layer 400 is shown in FIG. 3D. Only the first tantalum layer 460 exists above the via bottom in the dielectric layer 440. The tantalum atoms 520 that escape from the via bottom in the dielectric layer 440 is deposited on the sidewall of the downside of the via in the dielectric layer 440. Then, the figure of the structure is shown in FIG. 3D. Further, as shown in FIG. 3E, a second tantalum layer 500 is formed on the tantalum nitride layer 480 by a method such as the aforementioned method used for forming the first tantalum layer 460. The second tantalum layer 500 can be formed by PVD processes or CVD processes. The second tantalum layer 500 is formed by PVD processes in the present embodiment. A plasma reactor 60 is shown in FIG. 4, the wafer 62 is secured to the wafer supporter 61 and the wafer supporter 61 is connected to the direct current (DC) bias 65. The tantalum target 64 is secured to the metal target base 63 and the metal target base 63 is grounded. In the PVD processes, argon ions will bombard the tantalum target 64 and the tantalum atoms or ions will be attracted by the DC bias 65 to be deposited on the wafer 62 thereby forming the second tantalum layer 500. In the PVD processes, the process pressure in the plasma reactor 60 is about from 0 torrs to 50 millitorrs and the process temperature in the plasma reactor 60 is about from 0 degrees centigrade to 400 degrees centigrade.

After completing the aforementioned steps, the barrier layers of the damascene structure 40 are shown in FIG. 3E. Only the tantalum layer consisting of the first tantalum layer 460 and the second tantalum layer 500 exists above the via bottom in the dielectric layer 440 of the damascene structure 40, however the three barrier layers exist on all the other portions of the damascene structure 40 except the via bottom. The three barrier layers are the first tantalum layer 440, the tantalum nitride layer 480, and the second tantalum layer 500 respectively. The tantalum is used because it has good adhesion to copper. The tantalum nitride is capable of preventing copper atoms from diffusing into surrounding dielectric layers. The barrier structure of the three barrier layers is thicker than the barrier layer of the side wall portion of a dual damascene structure in the prior art, and thus the barrier structure prevent copper atoms from diffusing into surrounding dielectric layers more efficiently. Besides, the portions of the tantalum layers directly above the via bottom of the dielectric layer has 30% lower resistance than that of the prior art. Therefore, the tantalum layer will have better ohmic contact with the copper layer below and the copper layer formed inside the damascene structure later.

Figure 6D:
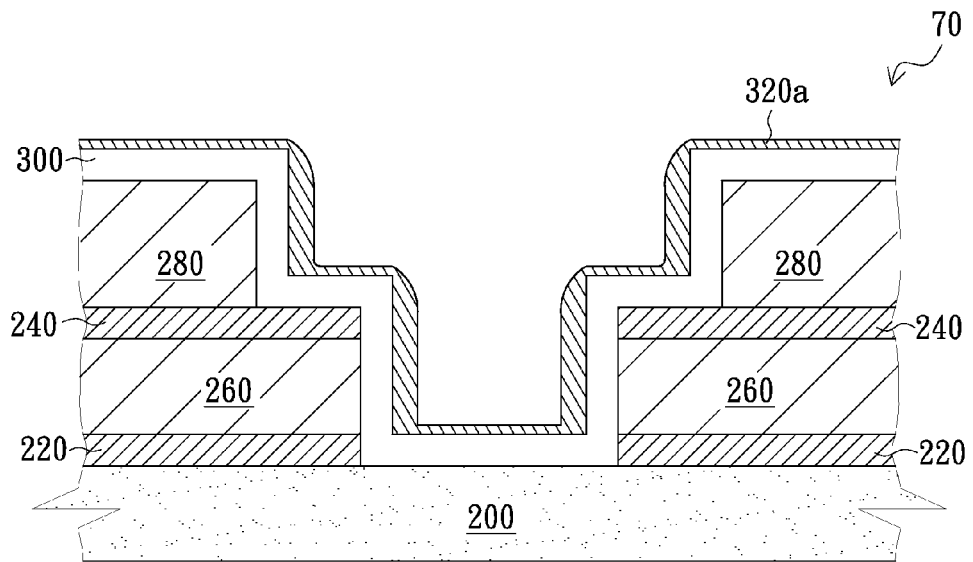
FIGS. 6D-6E shows an illustrative chart of the steps for forming multi-barrier layers on a dual damascene structure of a third embodiment in the present invention.
Figure 6E:
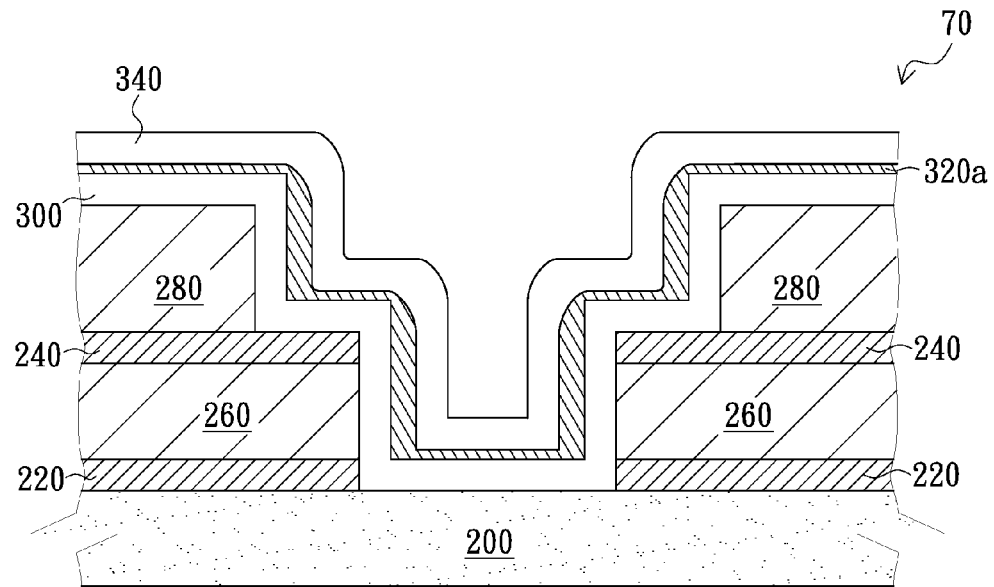

It is noted that the barrier layer of metallized materials disposed on the via bottom may be punched through in the above-mentioned embodiments, and may just be thinned in other embodiments. FIGS. 6D-6E illustrate a method for forming multi-barrier layers on a dual damascene structure of a third embodiment in the present disclosure. Compared with the first embodiment discussed previously, same labels will be carried forward through FIGS. 6D-6E.

As shown in FIG. 6D, a dual damascene structure 70 is formed on the metal layer 200 of a wafer, the first tantalum layer 300 is formed on the dual damascene structure 70, a tantalum nitride layer 320a is formed on the first tantalum layer 300, and an ion-bombardment process may be performed on the tantalum nitride layer 320a through the steps shown in FIG. 2A-2C. One difference between the first embodiment and the third embodiment is that the ion-bombardment process does not punch through the tantalum nitride layer 320a disposed on the via bottom in the third embodiment. In other words, only portions of the tantalum nitride layer 320a on the via bottom in the first dielectric layer 260 are removed. Portions of the tantalum nitride layer 320a may still remain on the via bottom and the via sidewall in the first dielectric layer 260 without removing the first tantalum layer 300 on the via bottom. In the ion-bombardment process, a self-direct current bias attracts argon ions 86 to bombard the tantalum nitride layer 320a, and the tantalum atoms 360 that escape from the tantalum nitride layer 320 on the via bottom move toward the via sidewall. Therefore, the tantalum nitride layer 320a may still remain on the whole via bottom in the first dielectric layer 260, and portions of the tantalum nitride layer 320a disposed on the via bottom is thinned by the ion-bombardment process.

As shown in FIG. 6E, the second tantalum layer 340 is formed on the tantalum nitride layer 320a. After completing the aforementioned steps, the tri-layer barrier structure including the first tantalum layer 300, the tantalum nitride layer 320a and the second tantalum layer 340 may be disposed on both the via bottom and the whole via sidewall. Portions of the tantalum nitride layer 320a disposed on the via bottom may be thinner than portions of the tantalum nitride layer 320a disposed on the via sidewall. After the second tantalum layer 340 is formed, a conductive layer, such as copper layer, (not shown) may be formed on the second tantalum layer 340 and filling the dual damascene structure 70. Since the resistivity of the tantalum nitride layer 320a varies with the proportion of the nitrogen atoms within the tantalum nitride layer 320a, and the tantalum nitride layer 320a may be thinned, the resistance above the via bottom in the first dielectric layer 260 can also be effectively reduced.

Figure 7D:
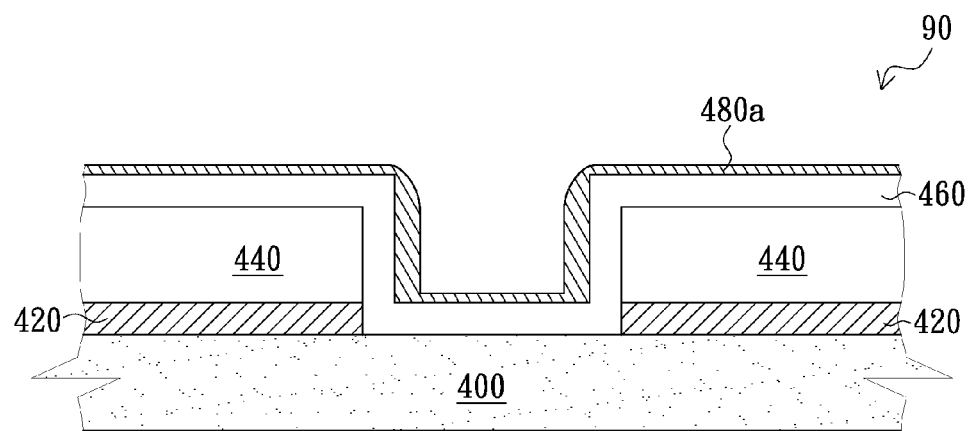
FIGS. 7D-7E shows an illustrative chart of the steps for forming multi-barrier layers on a damascene structure of a fourth embodiment in the present invention.
Figure 7E:
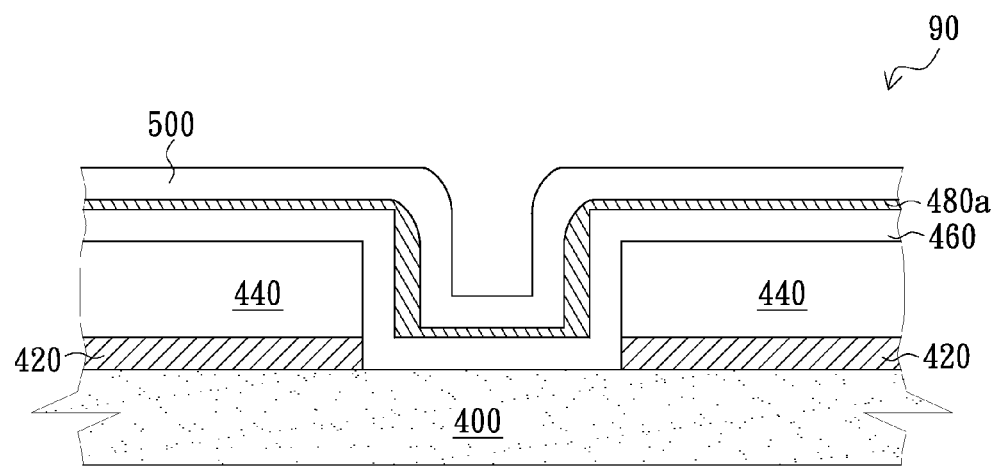

The ion-bombardment process without punching through the tantalum nitride layer may also be applied to a damascene structure. FIGS. 7D-7E, a method for forming multi-barrier layers on a damascene structure of a fourth embodiment in the present disclosure is illustrated. In order to compare to the second embodiment discussed previously, same labels will be carried forward through FIGS. 7D-7E.

As shown in FIG. 7D, a damascene structure 90 is formed on a metal layer 400 of a wafer, the first tantalum layer 460 is formed on the dual damascene structure 90, the tantalum nitride layer 480a is formed on the first tantalum layer 460, and an ion-bombardment process may be performed on the tantalum nitride layer 480a through the steps shown in FIG. 3A-3C. One difference between the second embodiment and the fourth embodiment is that the ion-bombardment process does not punch through the tantalum nitride layer 480a disposed on the via bottom in the fourth embodiment. In other words, only portions of the tantalum nitride layer 480a on the via bottom in the dielectric layer 440 are removed. Portions of the tantalum nitride layer 480a may still remain on the whole bottom and the whole via sidewall in the dielectric layer 440 without removing the first tantalum layer 460 on the via bottom.

As shown in FIG. 7E, the second tantalum layer 500 is formed on the tantalum nitride layer 480a. After completing the aforementioned steps, the tri-layer barrier structure including the first tantalum layer 300, the tantalum nitride layer 480a and the second tantalum layer 500 may be disposed on both the via bottom and the whole via sidewall. Portions of the tantalum nitride layer 480a disposed on the via bottom may be thinner than portions of the tantalum nitride layer 480a disposed on the via sidewall. Since the resistivity of the tantalum nitride layer 480a varies with the proportion of the nitrogen atoms within the tantalum nitride layer 480a, and the tantalum nitride layer 480a may be thinned, the resistance above the via bottom in the dielectric layer 440 can also be effectively reduced.

Moreover, the multi-barrier layers formed on the damascene structure or on the dual damascene structure may include more than three barrier layers in other embodiments. Please refer to FIGS. 8B-8E, a method for forming multi-barrier layers on a dual damascene structure of a fifth embodiment in the present invention is illustrated. In order to compare to the first embodiment discussed previously, same labels will be carried forward through FIGS. 8B-8E.

Figure 8B:
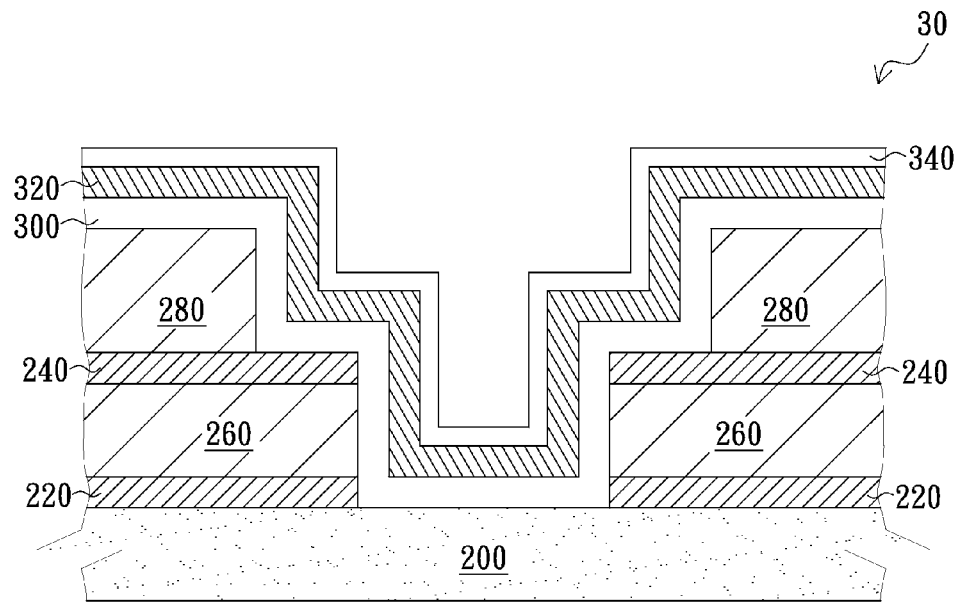
FIGS. 8B-8E shows an illustrative chart of the steps for forming multi-barrier layers on a dual damascene structure of a fifth embodiment in the present invention.

As shown in FIG. 8B, a dual damascene structure 30 is first formed on the metal layer 200 of a wafer, the first tantalum layer 300 is formed on the damascene structure 50, and the tantalum nitride layer 320 is formed on the first tantalum layer 300 through the steps shown in FIG. 2A-2B. One difference between the first embodiment and the fifth embodiment is that a second tantalum layer 340 is further formed on the tantalum nitride layer 320 before the ion-bombardment process in the fifth embodiment.

Figure 8C:
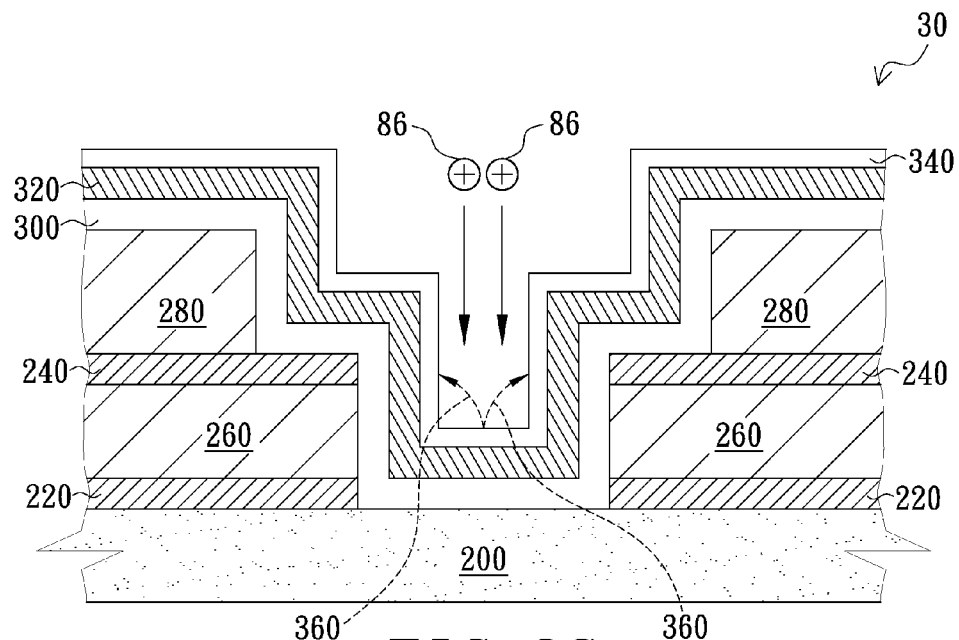
Figure 8D:
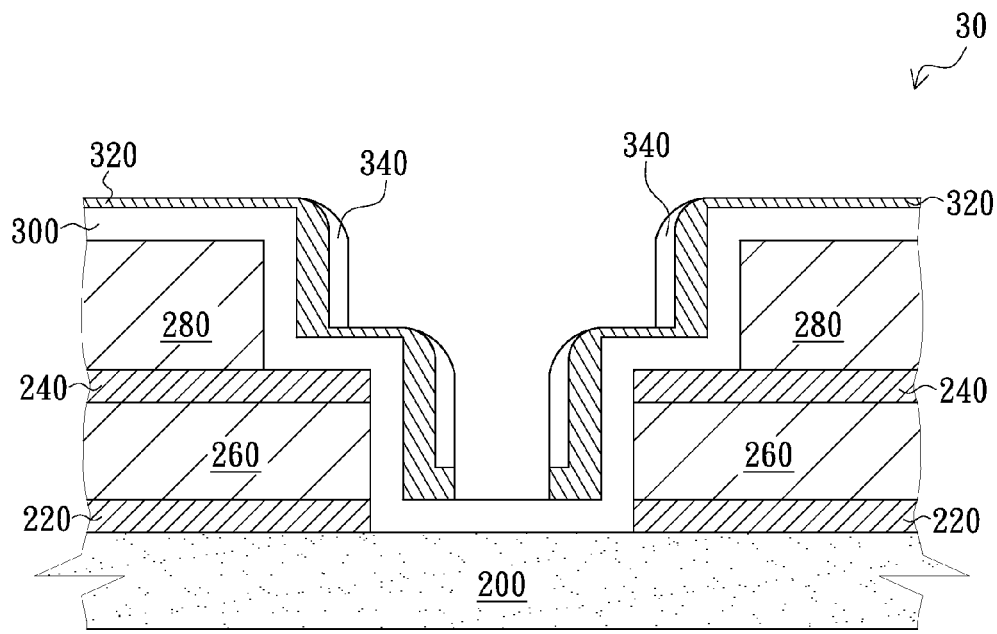

As shown in FIG. 8C-8D, an ion-bombardment process may be performed next on both the second tantalum layer 340 and the tantalum nitride layer 320. The ion-bombardment process may first remove the second tantalum layer 340, and may subsequently remove the tantalum nitride layer 320 after the second tantalum layer 340 is punched through. In this embodiment, the ion-bombardment process may punch through both the second tantalum layer 340 and the tantalum nitride layer 320 disposed on the via bottom. Only the first tantalum layer 300 exists above the via bottom in the first dielectric layer 260. The ion-bombardment process may leave the second tantalum layer 340 and the tantalum nitride layer 320 remaining on the whole via sidewall in the first dielectric layer 260 without removing the first tantalum layer 300 on the via bottom.

Figure 8E:
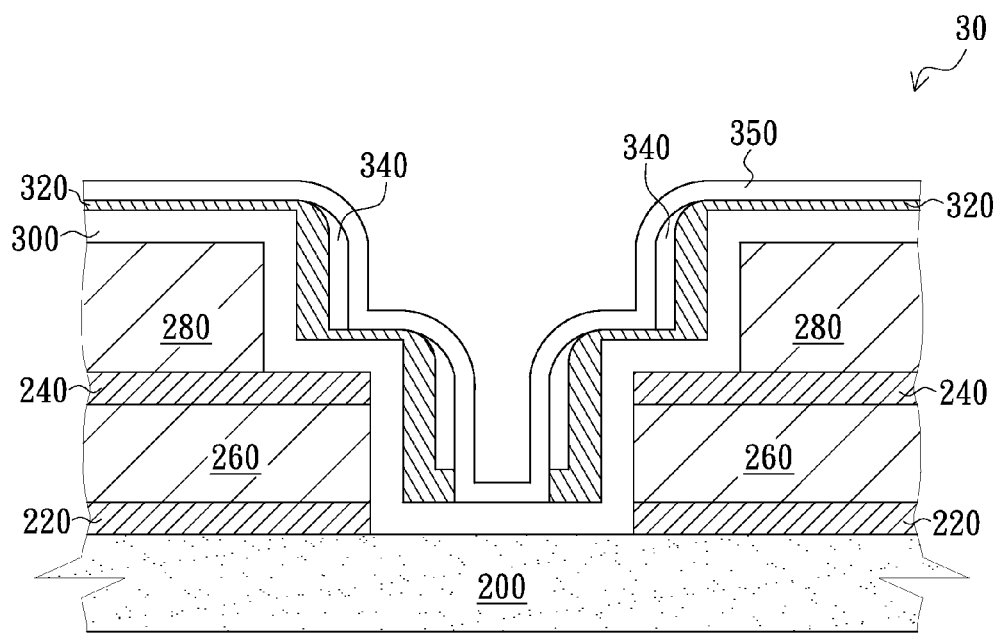

As shown in FIG. 8E, the third tantalum layer 350 is formed on the second tantalum layer 340 and the tantalum nitride layer 320. After completing the aforementioned steps, both the first tantalum layer 300 and the third tantalum layer 350 may be disposed on the via bottom; and the first tantalum layer 300, the tantalum nitride layer 320, the second tantalum layer 340 and the third tantalum layer 350 may be disposed on the whole via sidewall. In other words, there are four barrier layers, which include the first tantalum layer 300, the tantalum nitride layer 320, the second tantalum layer 340 and the third tantalum layer 350, on the via sidewall to prevent copper atoms from diffusing into surrounding dielectric layers. Portions of the tantalum nitride layer 320 disposed on the via bottom is punched through or thinned. After the third tantalum layer 350 is formed, a conductive layer, such as copper layer, (not shown) may be formed on the third tantalum layer 350 and filling the dual damascene structure 30. Since the resistivity of the tantalum nitride layer 320 varies with the proportion of the nitrogen atoms within the tantalum nitride layer 320, and the tantalum nitride layer 320 may be punched through or thinned, the resistance above the via bottom in the first dielectric layer 260 can also be effectively reduced.

Figure 10E:
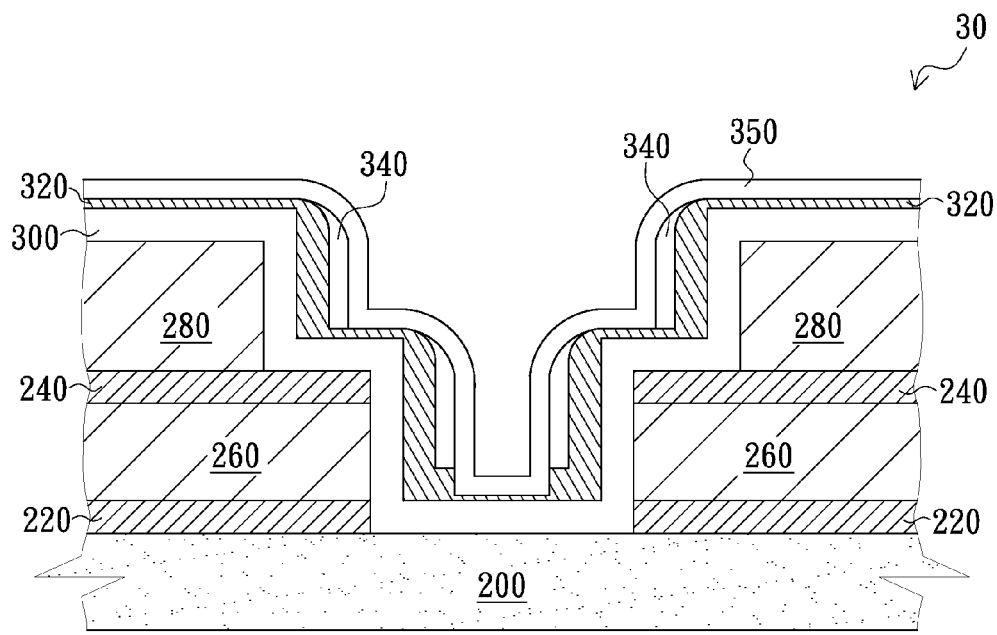
FIG. 10E shows an illustrative chart of forming multi-barrier layers on a dual damascene structure of a seventh embodiment in the present invention.

It can be understood that portions of the tantalum nitride layer 320 and/or portions of the second tantalum layer 340 may still remain on the via bottom in other embodiments, as shown in FIG. 10E.

The four-barrier layers may also be applied to a damascene structure. Please refer to FIGS. 9B-9E, a method for forming multi-barrier layers on a damascene structure of a sixth embodiment in the present invention is illustrated. In order to compare to the second embodiment discussed previously, same labels will be carried forward through FIGS. 9B-9E.

Figure 9B:
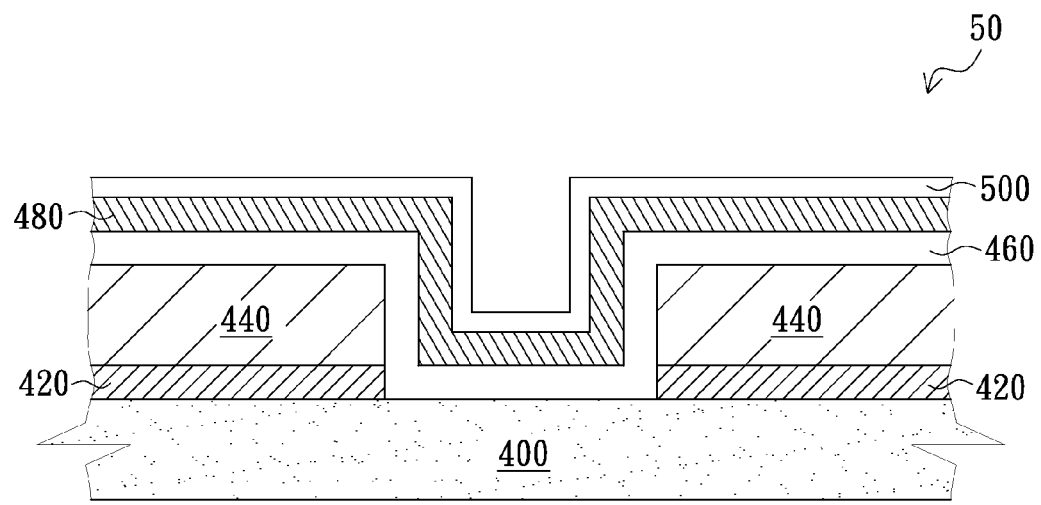
FIGS. 9B-9E shows an illustrative chart of the steps for forming multi-barrier layers on a damascene structure of a sixth embodiment in the present invention.

As shown in FIG. 9B, a damascene structure 50 is first formed on a metal layer 400 of a wafer, the first tantalum layer 460 is formed on the damascene structure 50, and the tantalum nitride layer 480 is formed on the first tantalum layer 460 through the steps shown in FIG. 3A-3B. One difference between the second embodiment and the sixth embodiment is that the second tantalum layer 500 is further formed on the tantalum nitride layer 480 before the ion-bombardment process in the sixth embodiment.

Figure 9C:
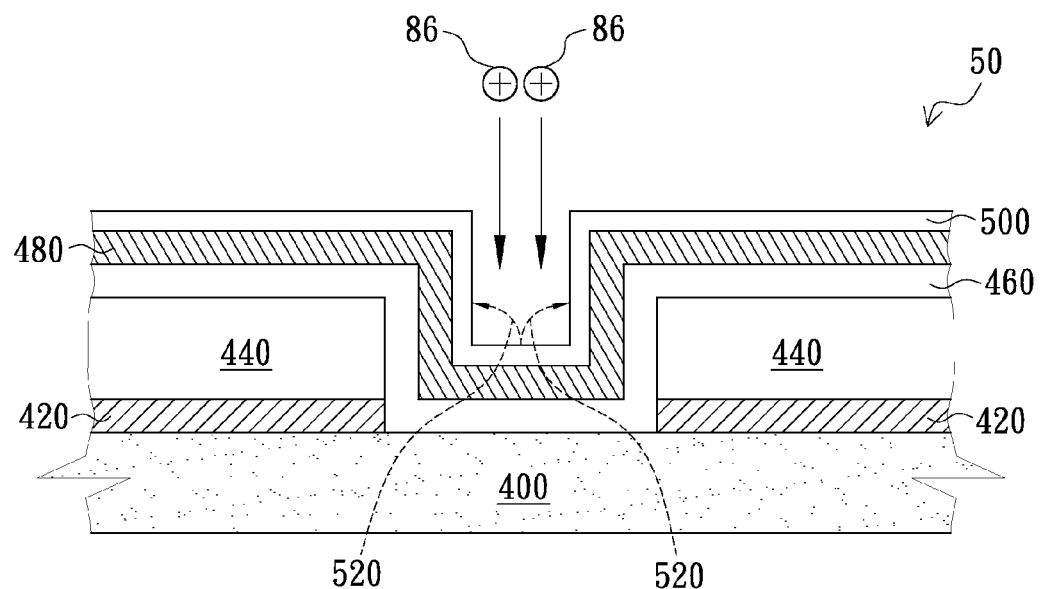
Figure 9D:
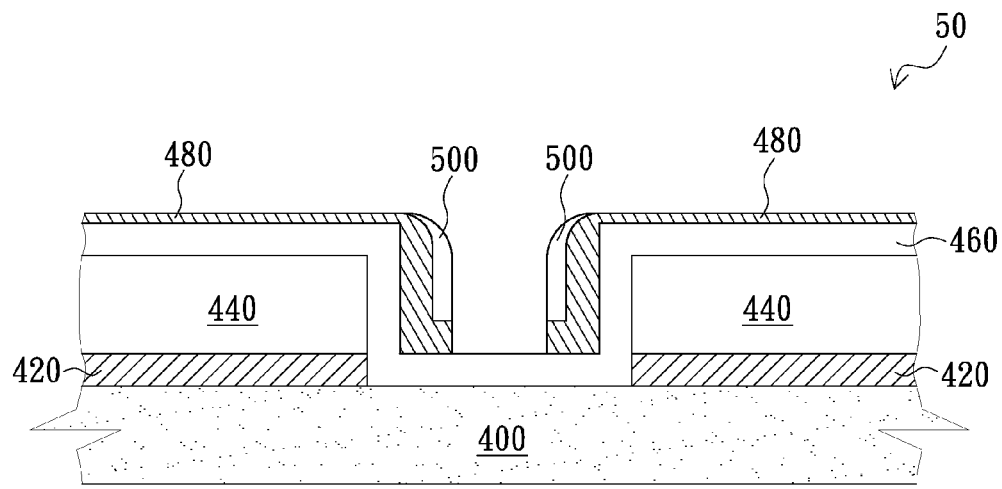

As shown in FIG. 9C-9D, an ion-bombardment process may be performed on both the second tantalum layer 500 and the tantalum nitride layer 480 on the via bottom. The ion-bombardment process may first remove the second tantalum layer 500, and may subsequently remove the tantalum nitride layer 480. In this embodiment, the ion-bombardment process may punch through both the second tantalum layer 500 and the tantalum nitride layer 480 disposed on the via bottom. The ion-bombardment process may leave both the second tantalum layer 500 and the tantalum nitride layer 480 remaining on the whole via sidewall in the dielectric layer 440 without removing the first tantalum layer 460 on the via bottom.

Figure 9E:
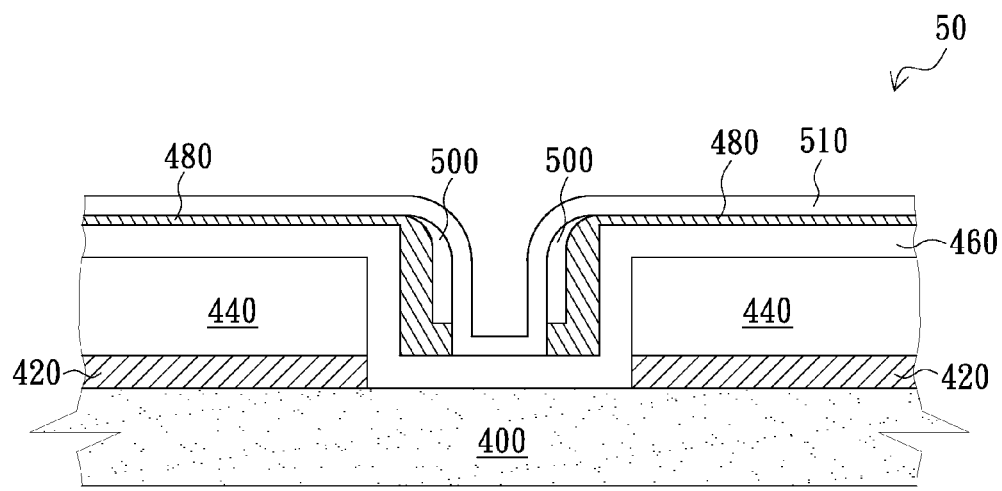

As shown in FIG. 9E, the third tantalum layer 510 is formed on the second tantalum layer 500 and the tantalum nitride layer 480. After completing the aforementioned steps, the first tantalum layer 460 and the third tantalum layer 510 may be disposed on the via bottom; and the first tantalum layer 460, the tantalum nitride layer 480, the second tantalum layer 500 and the third tantalum layer 510 may be disposed on the whole via sidewall. In other words, there are four barrier layers, which include the first tantalum layer 460, the tantalum nitride layer 480, the second tantalum layer 500 and the third tantalum layer 510, on the via sidewall to prevent copper atoms from diffusing into surrounding dielectric layers. Portions of the tantalum nitride layer 480 disposed on the via bottom is punched through or thinned. Since the resistivity of the tantalum nitride layer 480 varies with the proportion of the nitrogen atoms within the tantalum nitride layer 480, and the tantalum nitride layer 480 may be punched through or thinned, the resistance above the via bottom in the dielectric layer 440 can also be effectively reduced.

Figure 11E:
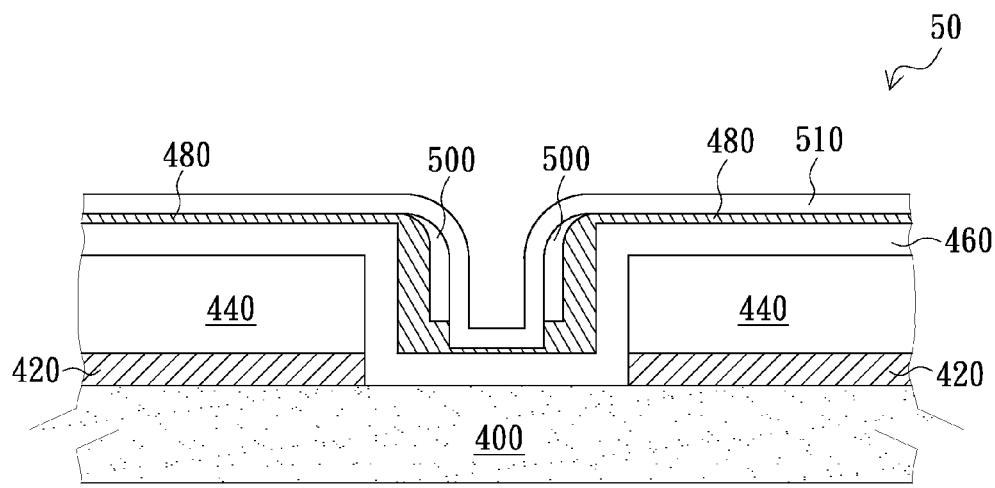
FIG. 11E shows an illustrative chart of forming multi-barrier layers on a damascene structure of an eighth embodiment in the present invention.

It can be understood that portions of the second tantalum layer 500 and portions of the tantalum nitride layer 480 may still remain on the via bottom in other embodiments, as shown in FIG. 11E.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments. As with the operating sequence of the present invention, many variations are possible, and any rearrangement of the operating sequence for achieving same functionality is still within the spirit and scope of the invention.

What is claimed is:

1. A damascene structure, comprising:
   a conductive layer;
   a first dielectric layer disposed on the conductive layer, the first dielectric layer having a via therein;
   a first barrier metal layer disposed on a via bottom and a via sidewall of the via in the first dielectric layer, the first barrier metal layer covering the conductive layer on the via bottom;
   a barrier layer covering the first barrier metal layer, wherein the barrier layer is comprised of a material different with that of the first barrier metal layer and comprises a first laterally extending portion and a second laterally longitudinally extending portion, the first laterally extending portion covers a portion of the first barrier metal layer disposed on the via bottom, the second laterally longitudinally extending portion covers the first barrier metal layer disposed on the via sidewall, and a thickness of the first laterally extending portion is thinner than a thickness of the second laterally longitudinally extending portion; and
   a second barrier metal layer covering the barrier layer on the via sidewall, exposing the barrier layer on the via bottom.

2. The damascene structure according to claim 1, wherein the barrier layer is comprised of tantalum nitride.

3. The damascene structure according to claim 1, wherein a bottom of the second barrier metal layer is spaced apart from the first barrier metal layer by the peripheral edge of the portion of the barrier layer disposed on the via bottom.

4. The damascene structure according to claim 1, wherein the damascene structure further comprises a copper layer covering the second barrier metal layer.

5. The damascene structure according to claim 4, wherein the copper layer covers the first laterally extending portion.

6. The damascene structure according to claim 1, wherein the second barrier metal layer covers the second longitudinally extending portion disposed on the via sidewall.

7. The damascene structure according to claim 1, further comprising a third barrier metal layer and a copper layer, wherein the third barrier metal layer covers the second barrier metal layer and the barrier layer, and the copper layer covers the third barrier metal layer.

8. The damascene structure according to claim 1, the second laterally longitudinally extending portion connects to the first laterally extending portion on the portion of the first barrier metal layer disposed on the via bottom.

9. A damascene structure, comprising:
   a conductive layer;
   a first dielectric layer, disposed above the conductive layer and having a via therein, wherein the via comprises a via sidewall and a via bottom;
   a second dielectric layer, disposed above the first dielectric layer and having a trench therein, wherein the trench connects to and exposes the via;
   a first barrier metal layer, disposed over the trench and the via and covering the conductive layer on the via bottom;
   a barrier layer, disposed on the first barrier metal layer, comprising a first laterally extending portion and a second laterally longitudinally extending portion, wherein the first laterally extending portion covers a portion of the first barrier metal layer disposed on the via bottom, the second laterally longitudinally extending portion covers the first barrier metal layer disposed on the via sidewall, and a thickness of the first laterally extending portion is thinner than a thickness of the second laterally longitudinally extending portion; and
   a second barrier metal layer, covering the barrier layer disposed on the via sidewall and exposing the barrier layer disposed on the via bottom.

10. The damascene structure according to claim 9, further comprising:
    a first etch-stop layer, disposed between the conductive layer and the first dielectric layer;
    a second etch-stop layer, disposed between the first dielectric layer and the second dielectric layer, wherein the trench exposes a portion of the second etch-stop layer; and
    a third barrier metal layer, disposed on both the second barrier metal layer and the barrier layer and covering the barrier layer disposed outside the via.

11. The damascene structure according to claim 10, wherein a portion of the barrier layer disposed on the via bottom contacts to and separates the third barrier metal layer and the first barrier metal layer.

* * * * *